(12) United States Patent
Kwak

(10) Patent No.: US 6,927,151 B2
(45) Date of Patent: Aug. 9, 2005

(54) METHOD OF MANUFACTURING SEMICONDUCTOR DEVICE

(75) Inventor: Noh Yeal Kwak, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/727,478

(22) Filed: Dec. 4, 2003

(65) Prior Publication Data

US 2004/0266149 A1 Dec. 30, 2004

(30) Foreign Application Priority Data

Jun. 30, 2003 (KR) .................................. 10-2003-0043627

(51) Int. Cl.[7] .............................................. H01L 21/425
(52) U.S. Cl. ...................... 438/527; 438/525; 438/289; 438/530
(58) Field of Search .............................. 438/289, 525, 438/527, 528, 530

(56) References Cited

U.S. PATENT DOCUMENTS 6,198,142 B1 * 3/2001 Chau et al. ................. 257/408
6,297,098 B1 * 10/2001 Lin et al. .................... 438/264
6,720,631 B2 * 4/2004 Brigham et al. ............ 257/408

* cited by examiner

Primary Examiner—Brad Smith
(74) Attorney, Agent, or Firm—Marshall, Gerstein & Borun LLP

(57) ABSTRACT

A method of manufacturing a semiconductor device is disclosed which comprises, forming a first well region by performing an ion implantation process for implanting first ions into a semiconductor substrate, and then forming a second well region in the first well region by performing an ion implantation process for implanting second ions having larger mass than the first ions; and forming a three-part or three-fold well region by performing an annealing process on the result structure wherein the lighter first ions are disposed in the upper and lower well regions and the heavier second ions are disposed in the middle well region. Therefore, it is possible to prevent TED phenomenon generated due to the high-energy heat treatment process to be performed later and to provide the increased activation ratio of ions compared to the conventional source/drain region in which only the ions having large mass are implanted by performing an annealing process after the first well region and the second well region are formed.

6 Claims, 2 Drawing Sheets

METHOD OF MANUFACTURING SEMICONDUCTOR DEVICE

BACKGROUND

1. Technical Field

A method of manufacturing a semiconductor device is disclosed, which is capable of preventing a transient enhanced diffusion (TED) phenomenon generated by ions of a well region as well as maintaining activation of ions implanted on the well region to the maximum extent when forming the well area.

2. Discussion of the Related Art

Recently, high-temperature heat treatment processes are used more and more frequently. But, ions implanted into a region forming a device including a semiconductor substrate become diffused during the high-temperature heat treatment process, and therefore characteristics of the device are deteriorated.

In particular, ions are implanted into an active region for forming a well region before a floating gate of a flash memory device is formed, and the ions for forming a well region must minimize the damage to a semiconductor substrate generated from an ion implantation process performed at high energy and maintain activation ratio of ions implanted into the well region (that is, coupling strength between ions implanted into a semiconductor substrate and the silicon of the substrate).

But, the ions formed in a well region so as to satisfy conditions mentioned above become diffused into another film, for example, an oxide film of a element isolation film due to the high-temperature heat treatment process to be performed later thereby causing the TED phenomenon.

SUMMARY OF THE DISCLOSURE

To solve the above problems, a method of manufacturing a semiconductor device is disclosed which is capable of maintaining activation of ions implanted into the well region to the maximum extent when forming the well area, minimizing the damage of a semiconductor substrate when performing an ion implantation process, and preventing transient enhanced diffusion (TED) phenomenon generated on ions of a well region.

One disclosed method of manufacturing a semiconductor device comprises forming a first well region by performing an ion implantation process for implanting first ions into a semiconductor substrate, and then forming a second well region in the first well region by performing an ion implantation process for implanting second ions having larger mass than the first ions; and forming a three-fold well region by performing an annealing process on the resultant structure wherein the lighter first ions are disposed in the upper and lower well regions and the heavier second ions are disposed in the middle well region.

According to another refinement, the first well region is formed by implanting phosphorus (P) ions at a tilt angle of 3° to 13° with a dose in the range of 1E11ions/cm$^2$ to 1E14 ions/cm$^2$ at an energy of about 500 KeV to 3000 KeV, by using a high-energy ion implantation device.

According to another refinement, the second well region is formed by implanting arsenic (As) ions having larger mass than phosphorus ions, at a tilt angle of 3° to 13° with a dose of 1E11 ions/cm$^2$ to 1E14 ions/cm$^2$ at an energy of about 100 KeV to 300 KeV, by using a middle-current ion implantation device.

According to another refinement, the annealing process is performed using one of an RTP process performed under $N_2$ or $H_2$ gas atmosphere at a temperature of 900° C. to 1000° C. for 10 seconds to 60 seconds, or a furnace process performed under $N_2$ or $H_2$ gas atmosphere at a temperature of 900° C. to 1100° C. for 10 minutes to 60 minutes.

According to another refinement, the method comprises forming a region into which ions for adjusting a threshold voltage are implanted on the semiconductor substrate on which well regions are formed, and then forming a tunnel oxide film, a floating gate electrode, a dielectric film and a control gate electrode on an upper part of the semiconductor substrate.

According to another refinement, the method comprises forming a screen oxide film serving as a buffer layer for suppressing a damage generated by the ion implantation process for forming the first well region and the second well region before forming the well region.

BRIEF DESCRIPTION OF THE DRAWINGS

The Other features of the disclosed methods will be explained in the following description, taken in conjunction with the accompanying drawings, wherein.

DETAILED DESCRIPTION OF PRESENTLY PREFERRED EMBODIMENTS

Figure 1:
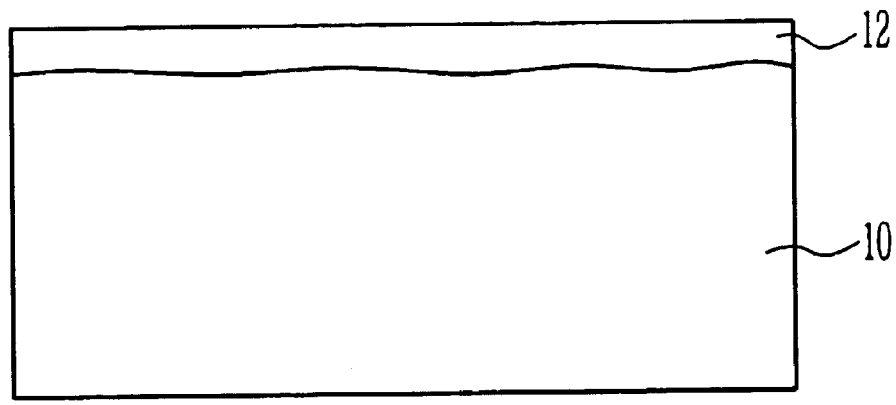
FIGS. 1 to 4 are views illustrating a method of forming a well region of a semiconductor device according to a preferred embodiment.

The disclosed methods will be described in detail by way of following preferred embodiments with reference to accompanying drawings. But, the following preferred embodiments can be modified into other embodiments within the scope of this disclosure by those having ordinary skill in the art and access to the teachings of this disclosure, and therefore the scope of this disclosure is not limited to the following embodiments. In the following explanation, thickness of a particular layer, etc., in the figures are blown up for convenience and clearness of explanation, and like reference numerals in the figures are used to identify the same or similar parts. Also, an expression that one layer exists on another layer or on a semiconductor substrate means that one layer may exist on the very another layer or on the semiconductor substrate, or other layer may lie between one layer and another layer or a semiconductor substrate.

FIGS. 1 to 4 are views illustrating a method of forming a well region of a semiconductor device according to a preferred embodiment.

Referring to FIG. 1, a screen oxide film 12 is formed on a front of an upper part of a semiconductor substrate 10. The semiconductor substrate 10 is divided into a region where p-channel transistor is formed (hereafter "PMOS region") and a region where n-channel transistor is formed (hereafter "NMOS region"). A method of forming a well region of the PMOS region is explained.

The screen oxide film 12 is formed for serving as a buffer layer for relieving damage generated in an ion implantation process to be performed later and preventing channeling of ion dopants. At this time, the screen oxide film 12 may be formed in a thickness of 50 to 70 Å by means of a wet oxidation method at a temperature of 750 to 800° C.

Figure 2:
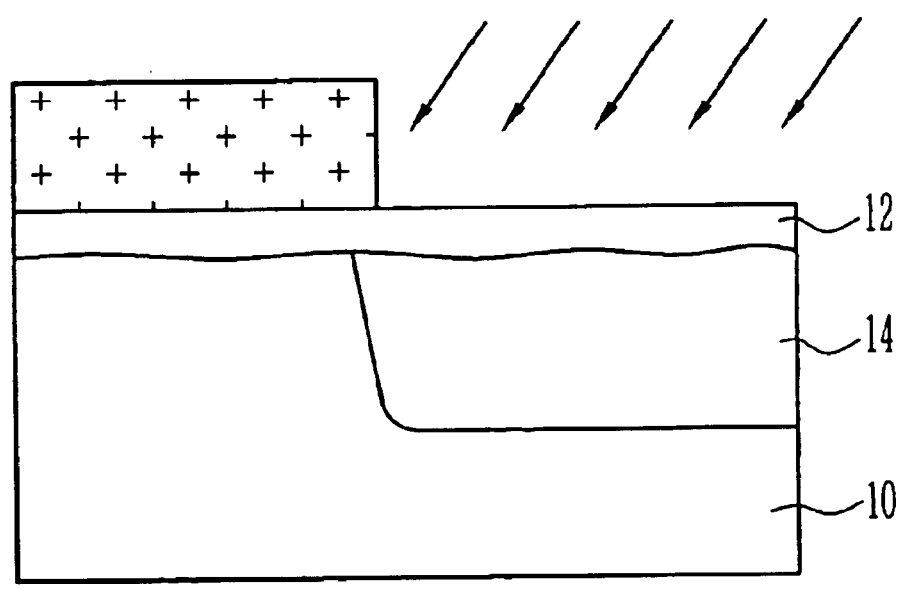

Referring to FIG. 2, a first region 14 defines a well region and is formed by forming a photoresist pattern (PR) on a predetermined region of the result structure and then performing a first ion implantation process on the semiconductor substrate 10 using the PR as a mask for implanting ions.

At this time, the ion implantation process is performed by implanting phosphorus (P) ions at a tilt angle of 3 to 13°, at a dose of 1E11 to 1E14 ions/cm$^2$, and to form the first region 14 at the energy of about 500 to 3000 KeV using a high-energy ion implantation device.

Figure 3:
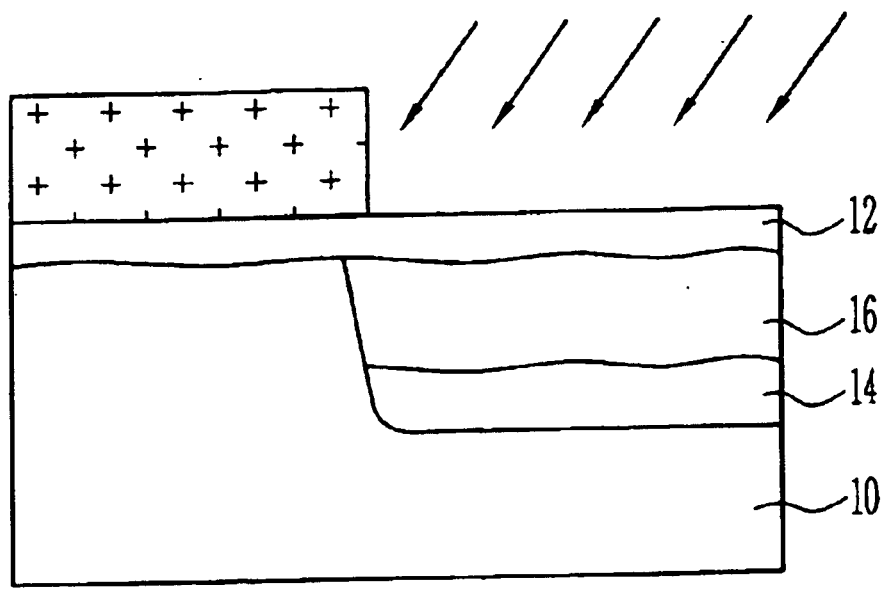

Referring to FIG. 3, a second region 16 is formed by performing a second ion implantation process on the first well region 14 using the PR as a mask for implanting ions. At this time, the ion implantation process for forming the second region 16 is performed by implanting arsenic (As) ions (size 75) having larger mass than phosphorus ions (size 31), which form the first region 14, at the tilt angle of 3 to 13° with a dose of 1E11 to 1E14 ions/cm$^2$ at the energy of about 100 to 300 KeV using a middle-current ion implantation device. Then, a process of eliminating the PR is performed.

Figure 4:
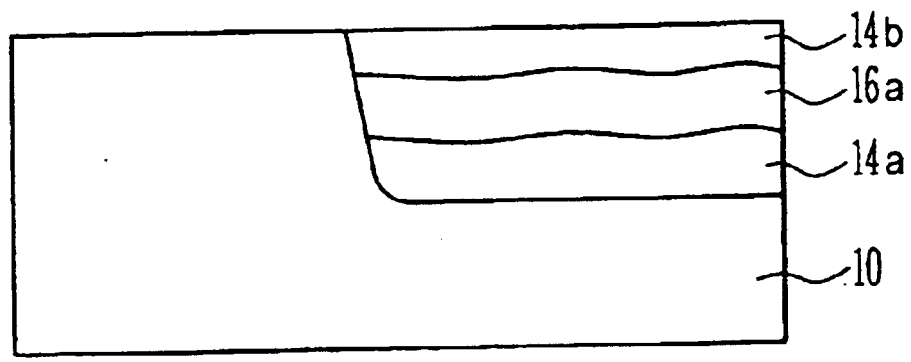

Referring to FIG. 4, when an annealing process is performed on the front of the result structure, a three-fold well region 14a/16a/14b having a first well region 14a implanted primarily with the first ions, a second well region 16a implanted primarily with the second ions and a third well region 14b implanted primarily with the first ions. The annealing results in the migration of the heavier and lighter ions into the three part well region 14a/16a/14b as shown in FIG. 4 with the heavier ions in the middle well region 16b and the lighter ions in the too and bottom well regions 14b, 14a. When an annealing process is performed after the first region 14 and the second region 16 are formed (see FIG. 3), the ion density of the region is increased. Then, the increase of the ion density of the well region makes it possible to prevent TED phenomenon generated due to the high-energy heat treatment process to be performed later such as an oxidation process by decreasing the diffusion speed of the implanted ions. Because ions having large mass and ions having small mass are implanted into same region and mixed, the activation ratio of ions is increased compared with the conventional well region in which only the ions having large mass are implanted.

Also, it is possible to compensate for the damage of the semiconductor substrate generated in the ion implantation process performed at high energy for forming the first and the second regions and the damage of the semiconductor substrate generated due to implantation of ions having large mass by performing said annealing process.

A rapid thermal process (RTP) annealing process or a furnace annealing process may be used as the annealing process mentioned above. The RTP annealing process is performed under N$_2$ or H$_2$ gas atmosphere at a temperature of 900 to 1000° C. for 10 to 60 seconds, and the furnace annealing process is performed under N$_2$ or H$_2$ gas atmosphere at a temperature of 900 to 1100° C. for 10 to 60 minutes. The screen oxide film 12 is removed after the annealing process.

A region into which ions for adjusting a threshold voltage are implanted is formed by performing an ion implantation process on the formed well region, and then a tunnel oxide film, a floating gate electrode, a dielectric film and a control gate electrode are formed on the semiconductor substrate on which said region are formed. Then a flash memory device is formed completely.

According to an embodiment, it is possible to prevent TED phenomenon generated due to the high-energy heat treatment process to be performed later such as an oxidation process and to provide the increased activation ratio of ions compared with the conventional source/drain region in which only the ions having large mass are implanted by performing an annealing process after the first well region and the second well region are formed.

Also, it is possible to compensate for the damage of the semiconductor substrate generated in the ion implantation process performed at high energy for forming the first and the second well regions and the damage of the semiconductor substrate generated due to implantation of ions having large mass by performing said annealing process.

Although the foregoing description has been made with reference to the preferred embodiments, it is to be understood that changes and modifications may be made by the ordinary skilled in the art without departing from the spirit and scope of the appended claims.

It is therefore intended by the appended claims to cover any and all such changes and modifications.

What is claimed is:

1. A method of manufacturing a semiconductor device, comprising:

performing a first ion implantation process for implanting first ions into a first region of a semiconductor substrate;

performing a second ion implantation process for implanting second ions into the first region wherein the second ions having a larger mass than the first ions; and performing an annealing process on the resulting structure to form a three-fold well region having a first lower well region implanted with the first ions, a second middle well region implanted with the second ions and a third upper well region implanted with the first ions.

2. A method of claim 1, wherein the first ion implantation process is performed by implanting phosphorus (P) ions at a tilt angle in the range of 3° to 13° with a dose in the range of 1E11 ions/cm$^2$ to 1E14 ions/cm$^2$ at an energy in the range of about 500 KeV to 3000 KeV, by using a high-energy ion implantation device.

3. A method of claim 1, wherein the second ion implantation process is performed by implanting arsenic (As) ions having larger mass than phosphorus ions, at a tilt angle in the range of 3° to 13° with a dose in the range of 1E11 ions/cm$^2$ to 1E14 ions/cm$^2$ at an energy in the range of about 100 KeV to 300 KeV, by using a middle-current ion implantation device.

4. A method of claim 1, wherein the annealing process is performed using one of an RTP process performed under N$_2$ or H$_2$ gas atmosphere at a temperature in the range of 900° C. to 1000° C. for a time period in the range of 10 minutes to 60 seconds, or a furnace process performed under N$_2$ or H$_2$ gas atmosphere at a temperature in the range of 900° C. to 1100° C. for a time period in the range of 10 minutes to 60 minutes.

5. A method of claim 1, further comprising forming a region into which ions for adjusting a threshold voltage are implanted on the semiconductor substrate on which well regions are formed, and then forming a tunnel oxide film, a floating gate electrode, a dielectric film and a control gate electrode on an upper part of the semiconductor substrate.

6. A method of claim 1, further comprising forming a screen oxide film serving as a buffer layer for suppressing a damage generated by the ion implantation process for forming the first well region and the second well region before forming the well region.

* * * * *